US012598966B2

(12) United States Patent
La Tulipe et al.

(10) Patent No.: US 12,598,966 B2
(45) Date of Patent: Apr. 7, 2026

(54) METHOD FOR PRODUCING A THROUGH SEMICONDUCTOR VIA CONNECTION

(71) Applicant: IMEC VZW, Leuven (BE)

(72) Inventors: Douglas Charles La Tulipe, Heverlee (BE); Anne Jourdain, Grez-Doiceau (BE); Gaspard Hiblot, Leuven (BE)

(73) Assignee: IMEC VZW, Leuven (BE)

( * ) Notice: Subject to any disclaimer, the term of this patent is extended or adjusted under 35 U.S.C. 154(b) by 738 days.

(21) Appl. No.: 17/669,255

(22) Filed: Feb. 10, 2022

(65) Prior Publication Data

US 2022/0270924 A1      Aug. 25, 2022

(30) Foreign Application Priority Data

Feb. 11, 2021    (EP) ..................................... 21156498

(51) Int. Cl.
*H01L 21/768* (2006.01)
*H01L 23/544* (2006.01)

(52) U.S. Cl.
CPC ...... *H01L 21/76898* (2013.01); *H01L 23/544* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 8,946,007 B2 | 2/2015 | Doris et al. | |
| 2012/0018863 A1 | 1/2012 | Oganesian et al. | |
| 2013/0175673 A1 | 7/2013 | Jin et al. | |
| 2013/0299950 A1* | 11/2013 | Hummler .......... | H01L 21/76898 |
| | | | 438/459 |

(Continued)

FOREIGN PATENT DOCUMENTS

| | | |
|---|---|---|
| EP | 3035369 A1 | 6/2016 |
| EP | 3324436 A1 | 5/2018 |
| EP | 3671859 A1 | 6/2020 |

OTHER PUBLICATIONS

Extended European Search Report in European Patent Application No. 21156498.4 issued Jul. 28, 2021.
Van Olmen, J. et al, "3D Stacked IC Demonstration using a Through Silicon Via First Approach," Downloaded on Sep. 30, 2020, from IEEE Xplore, in 4 pages.

* cited by examiner

*Primary Examiner* — Brent A. Fairbanks
*Assistant Examiner* — Derek L Nielsen
(74) *Attorney, Agent, or Firm* — Knobbe, Martens, Olson & Bear, LLP

(57) ABSTRACT

The disclosed technology relates to methods for producing an interconnect structure on the back side of an integrated circuit chip. According to a first aspect, a via opening is etched in a top semiconductor layer, and filled with a sacrificial material, thereby forming a sacrificial pillar. Then front and back end of line portions are processed and the substrate is thinned. The etch stop layer and the sacrificial pillar are removed, and replaced an electrically conductive material forming a through semiconductor via. According to a second aspect, the sacrificial pillar is etched through the opening of a trench that intersects the pillar. Filling the trench with a conductive material also fills the cavity created by etching back the pillar resulting in an integral conductive pad and interconnect rail structure. The pillar can be removed and replaced by a conductive material, thereby creating the TSV connection.

22 Claims, 14 Drawing Sheets

(56)        References Cited

U.S. PATENT DOCUMENTS

| | | | |
|---|---|---|---|
| 2014/0077374 | A1 | 3/2014 | Lin et al. |
| 2015/0206827 | A1* | 7/2015 | Nakamura .............. H01L 24/11 |
| | | | 257/774 |
| 2015/0371927 | A1 | 12/2015 | Batra et al. |
| 2018/0068898 | A1* | 3/2018 | Walke .................. H10D 86/201 |
| 2018/0145030 | A1* | 5/2018 | Beyne .............. H01L 21/76898 |
| 2020/0152508 | A1 | 5/2020 | Jourdain et al. |
| 2020/0365509 | A1 | 11/2020 | Sasaki et al. |

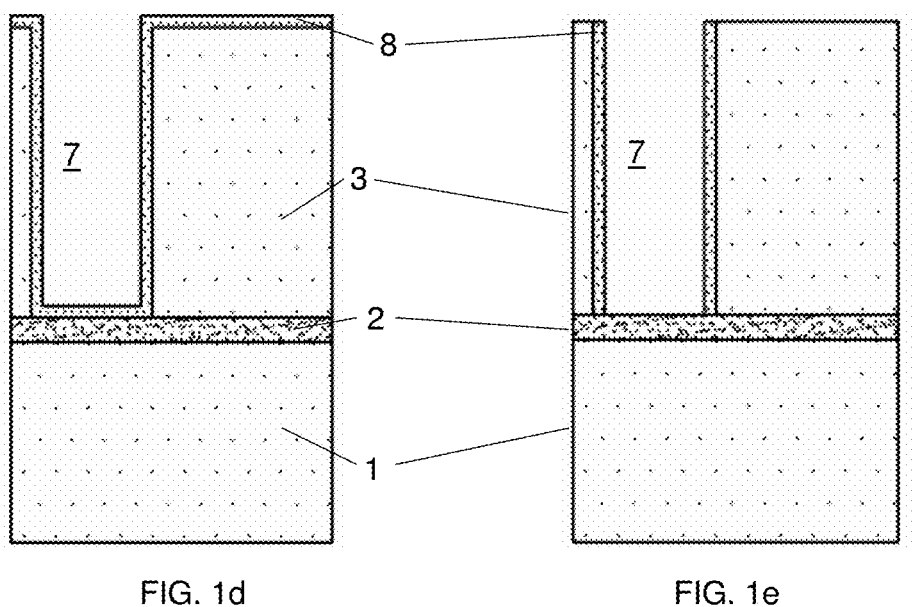
FIG. 1d                    FIG. 1e
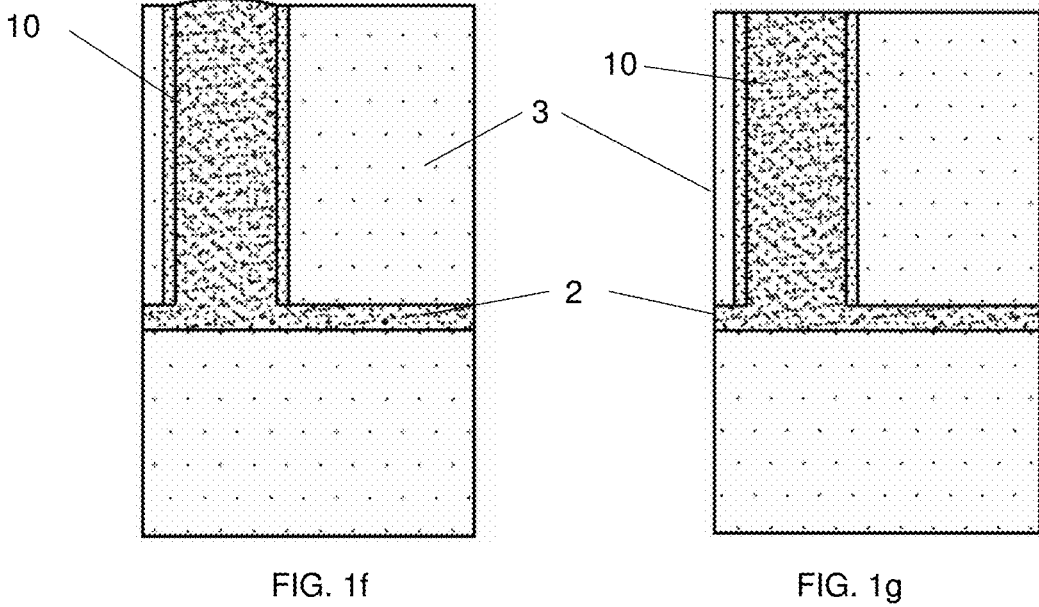
FIG. 1f                    FIG. 1g

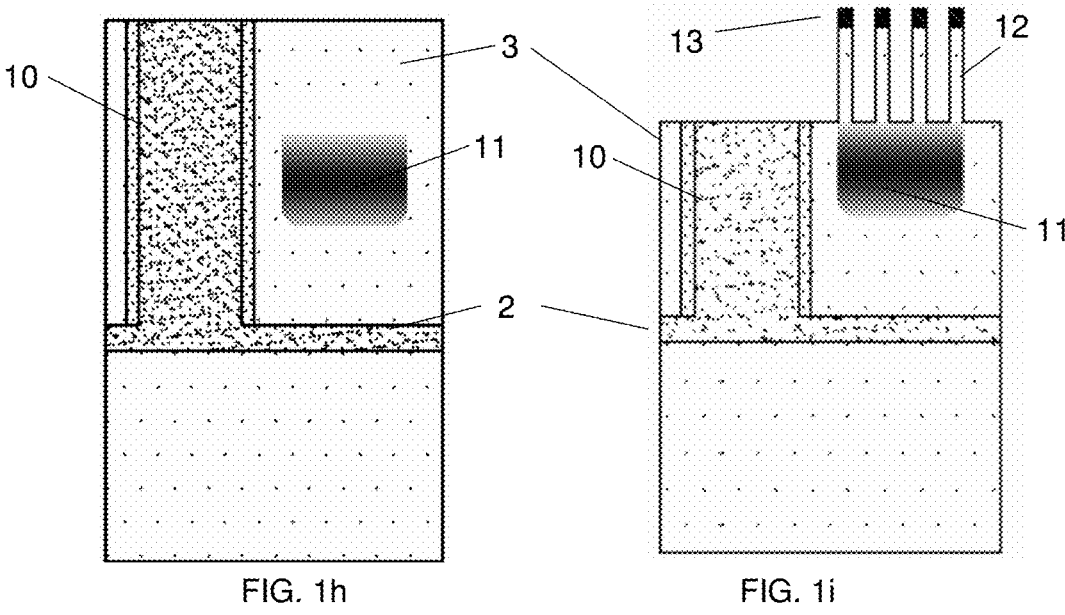
FIG. 1h                    FIG. 1i
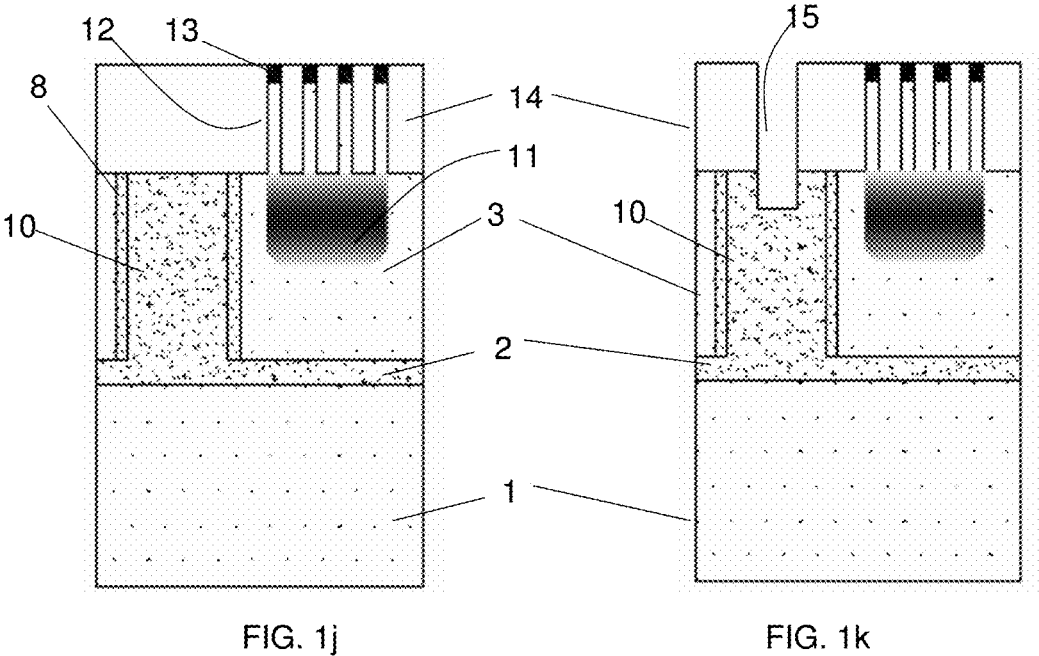
FIG. 1j                    FIG. 1k

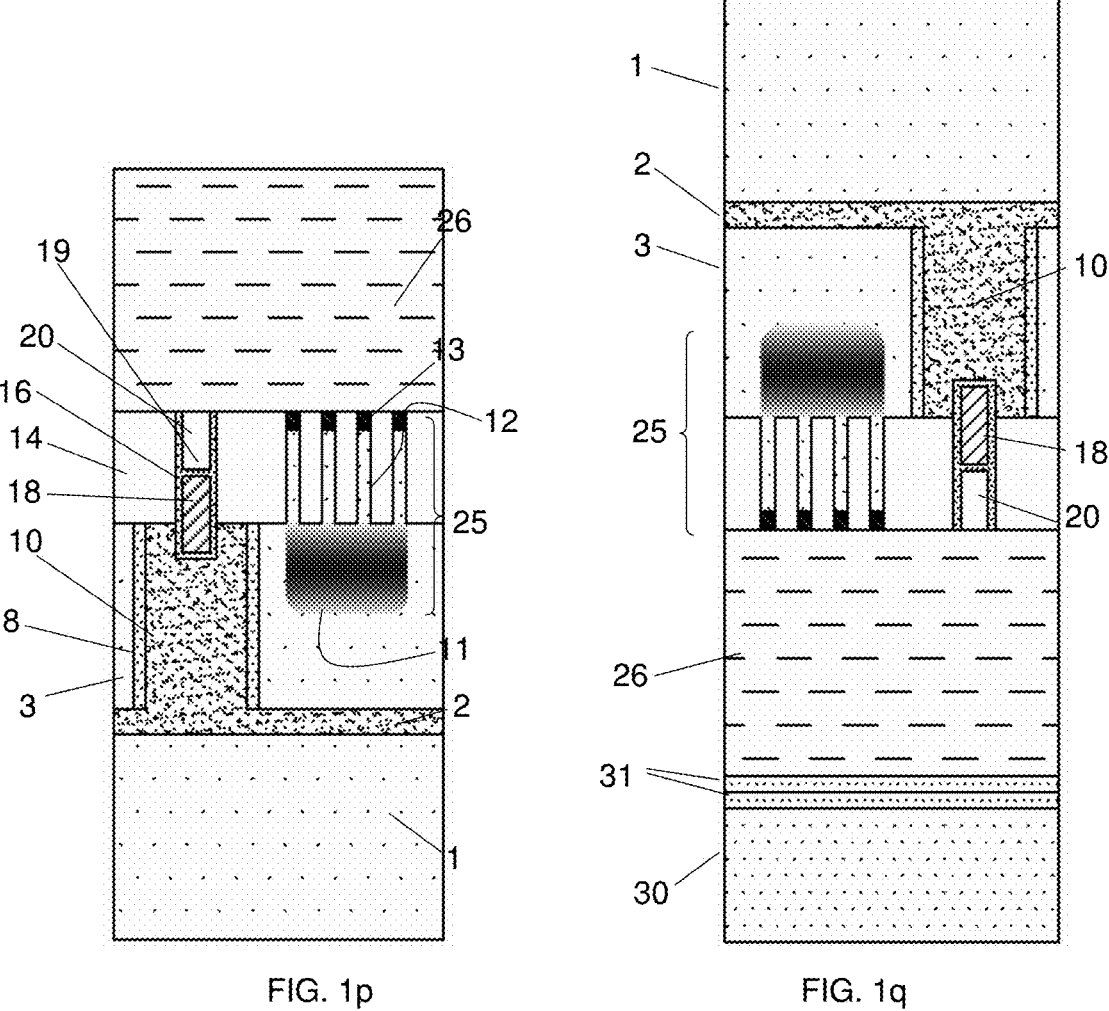
FIG. 1p                    FIG. 1q

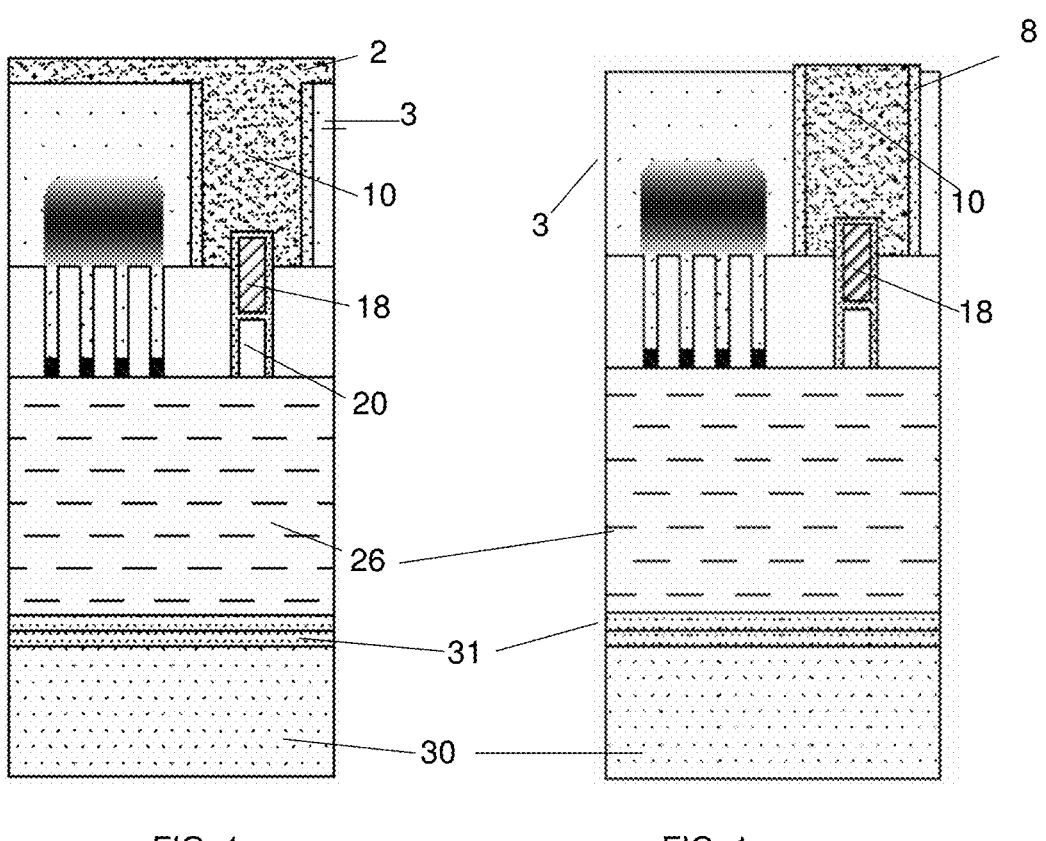
FIG. 1r                    FIG. 1s

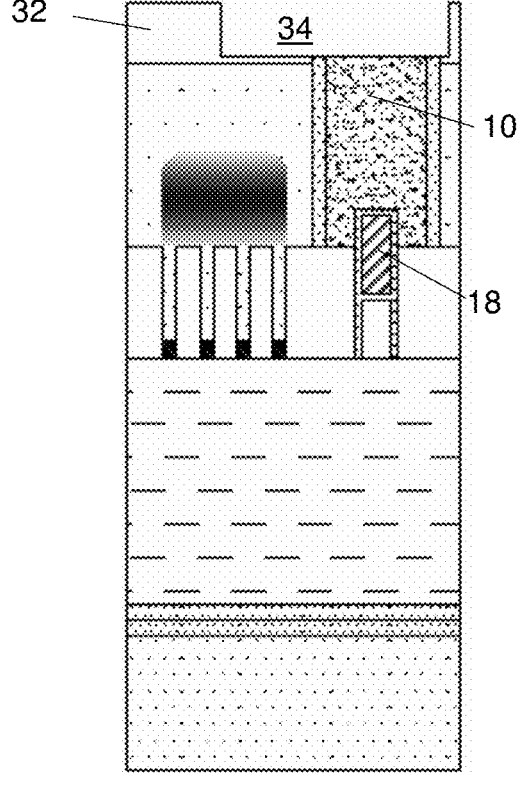
FIG. 1v                 FIG. 1w

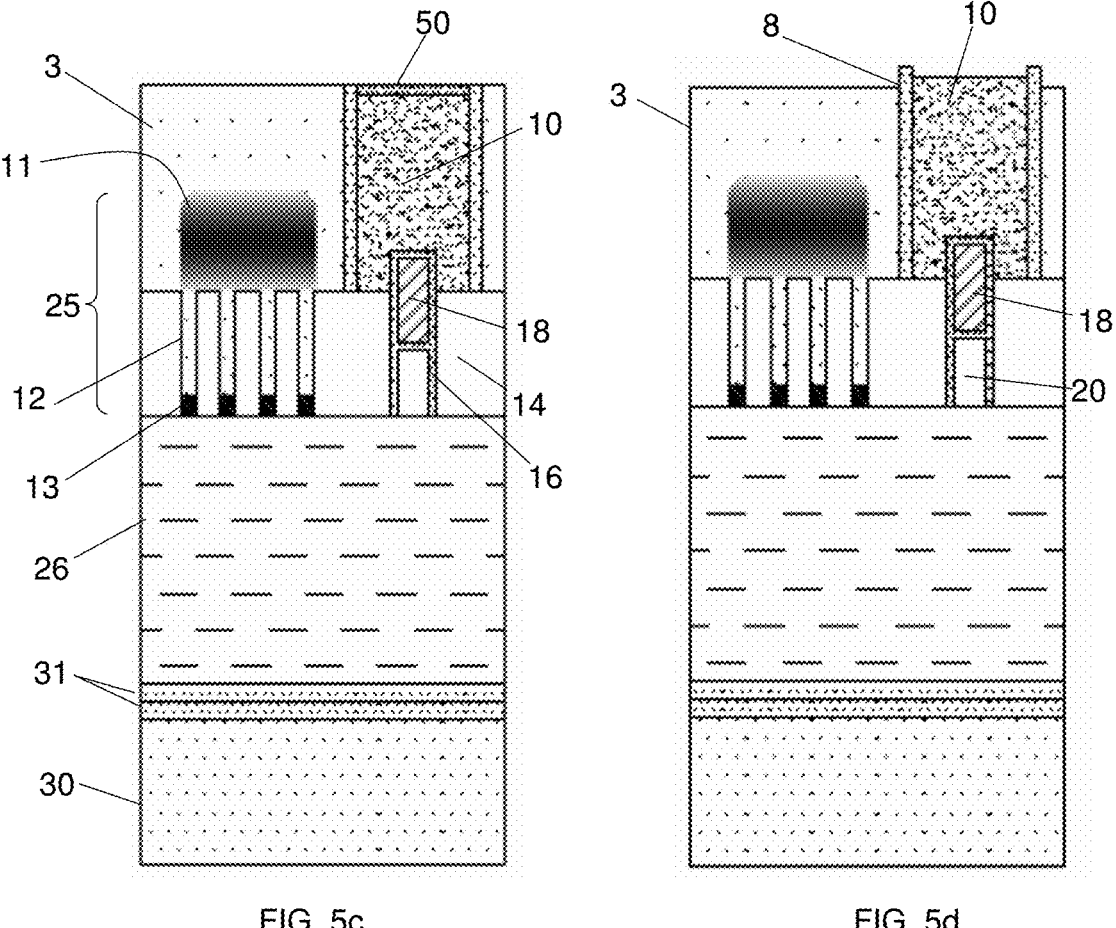
FIG. 5c                    FIG. 5d

METHOD FOR PRODUCING A THROUGH SEMICONDUCTOR VIA CONNECTION

CROSS-REFERENCE TO RELATED APPLICATIONS

This application claims foreign priority to EP21156498.4, filed Feb. 11, 2021, the content of which is incorporated by reference herein in its entirety.

BACKGROUND

Field

The present disclosure is generally related to semiconductor processing and more particularly to through via connections and methods of forming the same.

Description of the Related Technology

Semiconductor processing for the fabrication of integrated circuit (IC) chips continues to evolve towards increasing device-density: higher numbers of transistors and other active devices of ever decreasing device dimensions are placed on a given surface of semiconductor material. This miniaturization has put a strain on the design and fabrication of the interconnects between the front end of line (FEOL) of the IC, consisting mainly of the active devices, and the contact terminals of the IC. Traditionally, all of these interconnects are incorporated in the back end of line (BEOL) of the IC: a stack of metallization layers on top of the front end of line and comprising layers of circuitry interconnected by vertical via connections. The power delivery network (PDN) comprises conductors and vias connected to Voltage Drain Drain and the Voltage Source Source terminals of the chip, for delivering power to the individual devices in the front end of line. The integration of this power delivery network in the back end of line is particularly challenging because of the above named increase in device density.

SUMMARY OF CERTAIN INVENTIVE ASPECTS

Some solutions to the problem of increasing miniaturization involve the segregation of power delivery wiring from signal carrying wiring by integrating the PDN on the backside of the semiconductor chip and connecting it to the front side by so-called through semiconductor via connections (hereafter also referred to as TSVs), as applied in 3D integration technology. Patent publication document EP3324436 describes such a back-side power delivery network (BSPDN), wherein buried power rails are integrated in the front end of line during front side processing of a device wafer. The wafer is then bonded face down to a carrier wafer and thinned. Vias are then etched from the back and filled with metal to form TSVs which contact the buried rails, after which the PDN is fabricated on the back side of the wafer.

It is however difficult to scale this 'via-last' approach to the very small dimensions to which the semiconductor industry is evolving. Because of the wafer distortion induced during bonding, the buried rail pattern deformation within the wafer or within an IC is not linear and cannot be fully compensated during TSV patterning, making it impossible to achieve perfect alignment of backside TSVs to frontside buried interconnect rails across the wafer. The residual overlay will also vary across the wafer, depending on the wafer bonder and bonding mechanism used. This problem may be pattern specific.

Alternatives to the 'via-last' approach are the 'via-first' or 'via-mid' approaches. The latter option involves integration of TSVs from the frontside of the device wafer as part of the MOL (middle-end of line) or BEOL Cu wiring definition. Unfortunately, the presence of metallized TSVs in high density can induce significant pattern distortions due to stress and can drive the need for larger capture pads on the back side of the wafer to ensure connectivity. A via-mid integration strategy also has limited application and doesn't facilitate connectivity to buried power rail structures, due to wiring blockages.

The via-first approach is used for example in patent publication document US2013/0299950. According to the method described in this document, vias are etched from the front of the wafer before front end of line processing, and filled with a sacrificial material, for example polysilicon. After FEOL and BEOL processing, the wafer is thinned from the back side until the sacrificial material in the vias is revealed. The sacrificial material is then removed and the vias are filled with metal, followed by the formation of back side wiring and terminals. This solves a number of the problems identified above in relation to the via-last and via-mid approaches. However, the process described in US2013/0299950 is not compatible with buried power rails.

Another problem is related to the connectivity between the active devices on the front of the substrate and the TSV connections. Resistivity of the electrical path from the front to the back is often not satisfactory due to the small dimensions of the conductive area contacted from the back of the substrate. This problem is particularly acute in the context of buried power rails which have a very small width. Contacting these power rails from the back is therefore problematic in terms of obtaining a sufficiently large contact area between the rails and the TSV connections.

In view of these and other challenges, embodiments of the present disclosure are directed to methods for producing an interconnect structure on the back side of an integrated circuit chip, for example a conductor in a first level of a backside power delivery network, the interconnect structure being connected to the front side of the IC by at least one through semiconductor via (TSV) connection. According to a first aspect, the TSV connection is produced by etching a via opening from the front of a substrate consisting of a bulk semiconductor wafer, an etch stop layer and a top semiconductor layer. In some embodiments, the via opening is etched in the top layer, stopping on the etch stop layer. In some embodiments, the via opening is filled with a sacrificial material, possibly the same material as the etch stop layer, thereby forming a sacrificial pillar. In some embodiments, the FEOL and BEOL portions are processed and the substrate is bonded face down to a carrier wafer, after which the substrate is thinned by removing the bulk wafer, using at the end an etch process that stops on the etch stop layer. In some embodiments, the etch stop layer and the sacrificial pillar are removed, creating a cavity, or empty area or space, preferably lined by a dielectric insulating liner. In some embodiments, the dielectric insulating cavity liner is etched in such a way as to remove only the material on a bottom surface of the cavity while the dielectric lining on the vertical sidewall of the cavity is preserved, thus exposing the electrically conductive structure of the FEOL portion, for example, to a buried interconnect rail. In some embodiments, the TSV connection can be produced by filling the cavity with an electrically conductive material, followed by producing the backside interconnect structure.

According to different aspect, the sacrificial pillar is reduced in height by partially etching back the pillar through the opening of a trench that intersects the pillar, the trench being intended for the production of a buried interconnect rail. In some embodiments, filling of the trench with a conductive material also fills the cavity created by etching back the pillar, resulting in a conductive pad that is integral with the buried interconnect rail formed in the trench. In some embodiments, after thinning the substrate from the back, the reduced-height sacrificial material is removed and replaced by a conductive material, thereby creating the TSV connection.

In more detail, the first aspect is related to a method for producing an interconnect structure on the back side of a semiconductor substrate portion of an integrated circuit (IC) chip, the interconnect structure being connected to the front side of the semiconductor substrate portion by at least one through semiconductor via a TSV connection, the method can comprise the steps of:

providing a substrate formed of a bulk semiconductor wafer, a blanket etch stop layer on the bulk semiconductor wafer, and a top semiconductor layer on the etch stop layer, wherein the semiconductor substrate portion of the IC chip is a portion of the top layer. The blanket etch stop layer is suitable for stopping the removal of the bulk semiconductor wafer by etching at least a portion of the wafer that is in contact with the etch stop layer, from the back side of the wafer.

etching at least one TSV-related via opening in the top semiconductor layer, stopping on the blanket etch stop layer that forms the bottom of the via opening, filling the etched via opening, and forming a pillar formed of the sacrificial material, producing a front end of line (FEOL) portion of the IC chip on the front side of the top semiconductor layer, wherein at least one electrically conductive structure of the FEOL portion is in physical contact with the pillar, producing a back end of line (BEOL) portion of the IC chip on top of the FEOL portion, bonding the substrate with its front side to a carrier substrate, thinning the substrate by removing the bulk semiconductor wafer, the thinning step ending with an etch process that stops on the blanket etch stop layer, removing the blanket etch stop layer, removing the sacrificial material of the pillar in order to create an open cavity wherein said conductive structure of the FEOL portion is exposed in the open cavity, filling the open cavity with an electrically conductive material, thereby creating a through semiconductor via (TSV) connection from the front side of the top semiconductor layer to the back side of the top semiconductor layer, producing the interconnect structure on the back side of the top semiconductor layer, the interconnect structure contacting the TSV connection.

According to an embodiment of the first aspect, the sacrificial material of the pillar is the same or epitaxially similar material as the material of the blanket etch stop layer, wherein the pillar is produced by local deposition of the sacrificial material, using the material of the blanket etch stop layer at the bottom of the via opening as a seed layer.

According to another embodiment of the first aspect, a second etch stop layer is produced on the bottom of the via opening, followed by deposition of the sacrificial material directly on top of the second etch stop layer, wherein the second etch stop layer is suitable for stopping the step of removing the blanket etch stop layer when at least a portion of the blanket etch stop layer is removed by an etch process. The second etch stop layer may protect or shield the blanket etch stop layer from the etch or etching material.

In some embodiments, the conductive structure of the FEOL portion may be at least part of one of an array of buried interconnect rails which are partially buried in the top semiconductor layer, wherein the buried interconnect rails intersect the sacrificial pillar.

According to some embodiments, a dielectric liner separates the buried rails from the surrounding portions of the substrate, and the step of removing the sacrificial material of the pillar includes removing an exposed portion of the dielectric liner.

According to some embodiments, the conductive structure of the FEOL portion is an interconnect via connected to an interconnect level of the BEOL portion.

According to an embodiment of the first aspect, a dielectric layer is produced on the sidewalls of the via opening or openings, thereby coating the sidewalls of the via opening or openings, prior to depositing the sacrificial material in the opening or openings.

According to some embodiments, multiple additional via openings are produced simultaneously with the at least one TSV-related via opening, the additional via openings are filled with the sacrificial material in the same step as the step of filling the TSV-related via opening, and the filled additional via openings form alignment marks suitable for positioning one or more etch masks on the back side of the top semiconductor layer.

In a second aspect, a method for producing an interconnect structure on the back side of a semiconductor substrate portion of an integrated circuit (IC) chip, the interconnect structure being connected to the front side of the semiconductor substrate portion by at least one through semiconductor via (TSV) connection is disclosed. In some embodiments, the method comprises the steps of:

providing a substrate consisting of a semiconductor material or comprising on its surface a top layer of semiconductor material, wherein the semiconductor substrate portion of the IC chip is formed by an upper layer of the substrate or by the top layer of semiconductor material, thereafter, etching at least one TSV-related via opening in the substrate or in said top layer of semiconductor material, thereafter, filling the etched via opening with a sacrificial material, thereby forming a pillar formed of the sacrificial material, thereafter, producing a front end of line (FEOL) portion of the IC chip on the substrate, the FEOL portion comprising an array of interconnect rails which are partially buried in the substrate or in the top layer of semiconductor material, wherein:

the rails are produced by first etching trenches, at least one of the trenches intersects the sacrificial pillar, by partially etching the material of the pillar, the material of the pillar is partially etched back through the trench, resulting in a first open cavity above a sacrificial pillar of reduced height, an electrically conductive material is deposited in the trench and in the first open cavity above the reduced-height pillar, thereby forming an electrically conductive pad that is integral with a buried rail, producing a back end of line (BEOL) portion of the IC chip on top of the FEOL portion, bonding the substrate with its front side to a carrier substrate, thinning the substrate from the back side until the reduced-height pillar formed of sacrificial material is exposed, removing the sacrificial material of the reduced-height pillar in order to create a second open cavity wherein the electrically conductive pad is exposed in said second open cavity, filling the second open cavity with an electrically conductive material, thereby creating a through semiconductor via (TSV) connection from the front of the thinned substrate to the back of the thinned substrate, producing the interconnect structure on the back side of the thinned substrate, the interconnect structure contacting the TSV connection.

According to an embodiment of the second aspect, the substrate can be formed of a bulk semiconductor wafer, a blanket etch stop layer on the bulk semiconductor wafer, and a top semiconductor layer on the etch stop layer. In some embodiments, the blanket etch stop layer is suitable for stopping the removal of the bulk semiconductor wafer by etching at least a portion of the wafer that is in contact with the etch stop layer, from the back side of the wafer. This protection may be caused by material properties of the blanket etch stop layer. Further according to the latter embodiment:

the at least one via opening is etched in the top semiconductor layer, stopping on the blanket etch stop layer that forms a bottom of the via opening, thinning of the substrate is done by removing the bulk semiconductor wafer, the thinning step ending with an etch process that stops on the blanket etch stop layer, after removal of the blanket etch stop layer, the sacrificial material of the reduced-height pillar is removed, in order to create the second open cavity.

In a method according to the second aspect, the sacrificial material of the pillar may be the same material as or epitaxially similar to the material of the blanket etch stop layer.

According to an embodiment of the second aspect, a second etch stop layer can be produced on the bottom of the via opening, followed by deposition of a sacrificial material directly on top of the second etch stop layer, wherein the second etch stop layer is suitable for stopping the removal of the blanket etch stop layer when at least a portion of the blanket etch stop layer is removed by an etch process.

According to an embodiment of the second aspect, a dielectric liner separates the buried rails and the electrically conductive pad from the surrounding portions of the substrate, wherein the step of removing the sacrificial material of the reduced height pillar includes removing an exposed portion of the dielectric liner.

According to an embodiment of the second aspect, a dielectric layer is produced on the sidewalls of the via opening, prior to depositing the sacrificial material in said via opening.

According to an embodiment of the second aspect, multiple additional via openings are produced simultaneously with the at least one TSV-related via opening, the additional via openings being filled with the sacrificial material in the same step as the step of filling the TSV-related via opening, wherein the filled additional via openings form alignment marks suitable for positioning one or more etch masks on the back side of the thinned substrate

BRIEF DESCRIPTION OF THE DRAWINGS

The above described aspects and implementations are explained in the following description of embodiments with respect to the enclosed drawings: The dimensions of the various layers and structures represented in the drawings are aimed at conceptually illustrating the various steps of the methods and are not drawn to scale with respect to actual integrated circuits.

FIGS. 4a to 4e schematically illustrate a fourth method for the fabrication of an IC, according to an embodiment.

FIGS. 5a to 5d schematically illustrate a fifth method for the fabrication of an IC, according to an embodiment

DETAILED DESCRIPTION OF CERTAIN ILLUSTRATIVE EMBODIMENTS

In the following detailed description, preferred embodiments are described, with reference to the drawings. Various details of the described embodiments do not limit the scope of the claims, the scope being defined only by the appended claims.

Figure 1A:
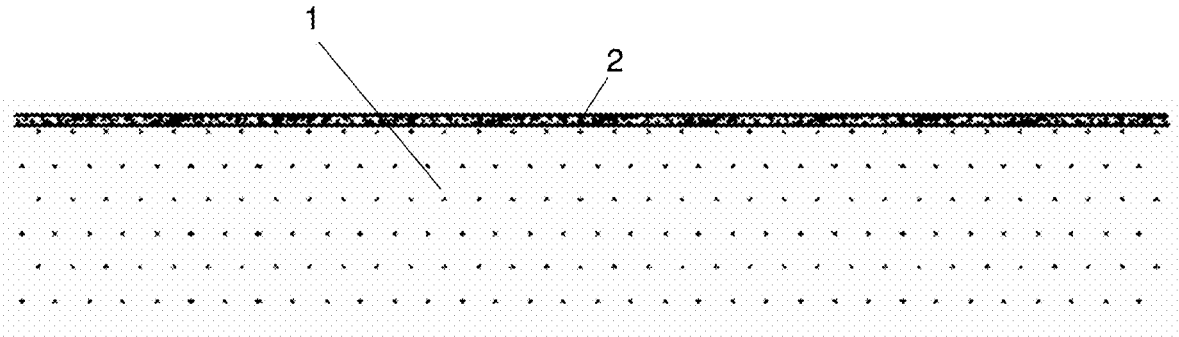
FIGS. 1a to 1y schematically illustrate a first method for fabrication of an IC, according to an embodiment.
Figure 1B:
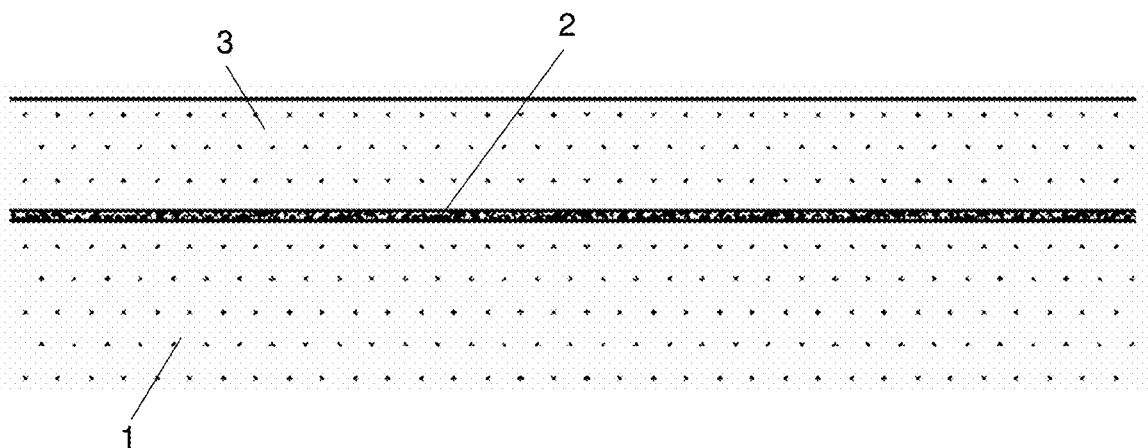
Figure 1C:
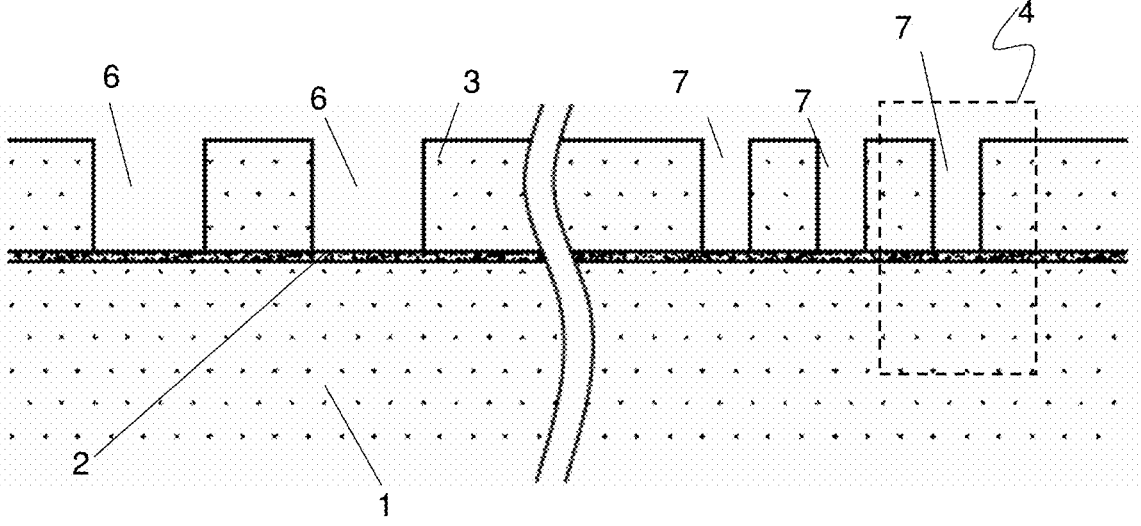
Figures 1L, 1M:
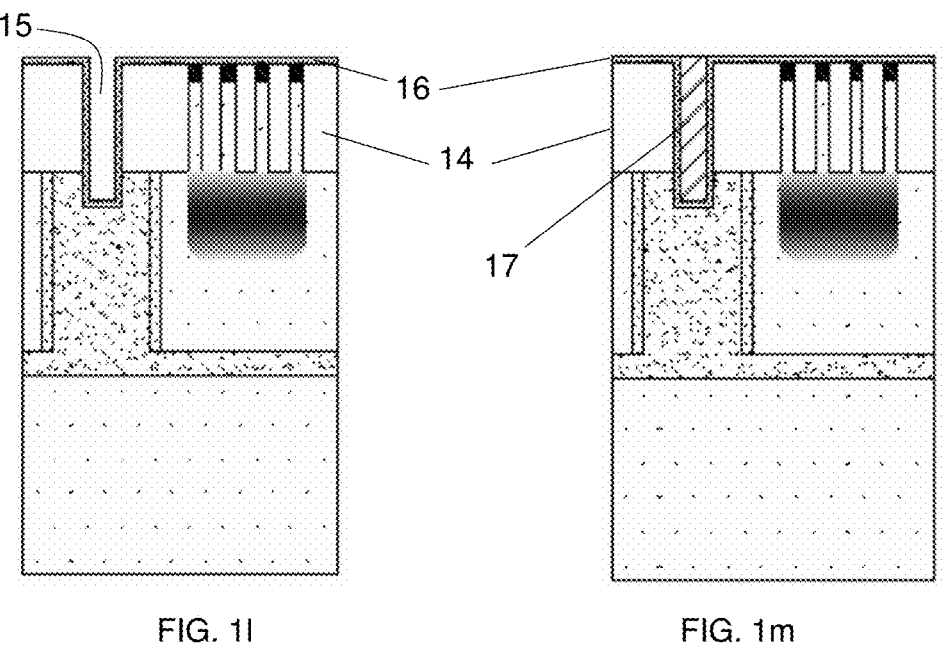
Figures 1N, 1O:
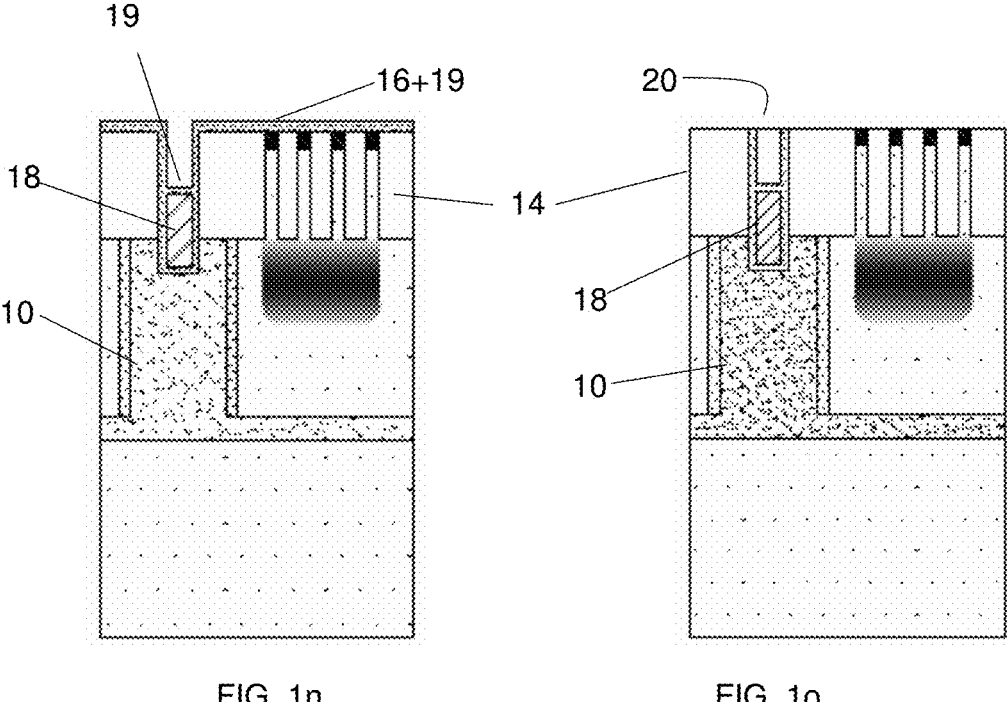
Figures 1T, 1U:
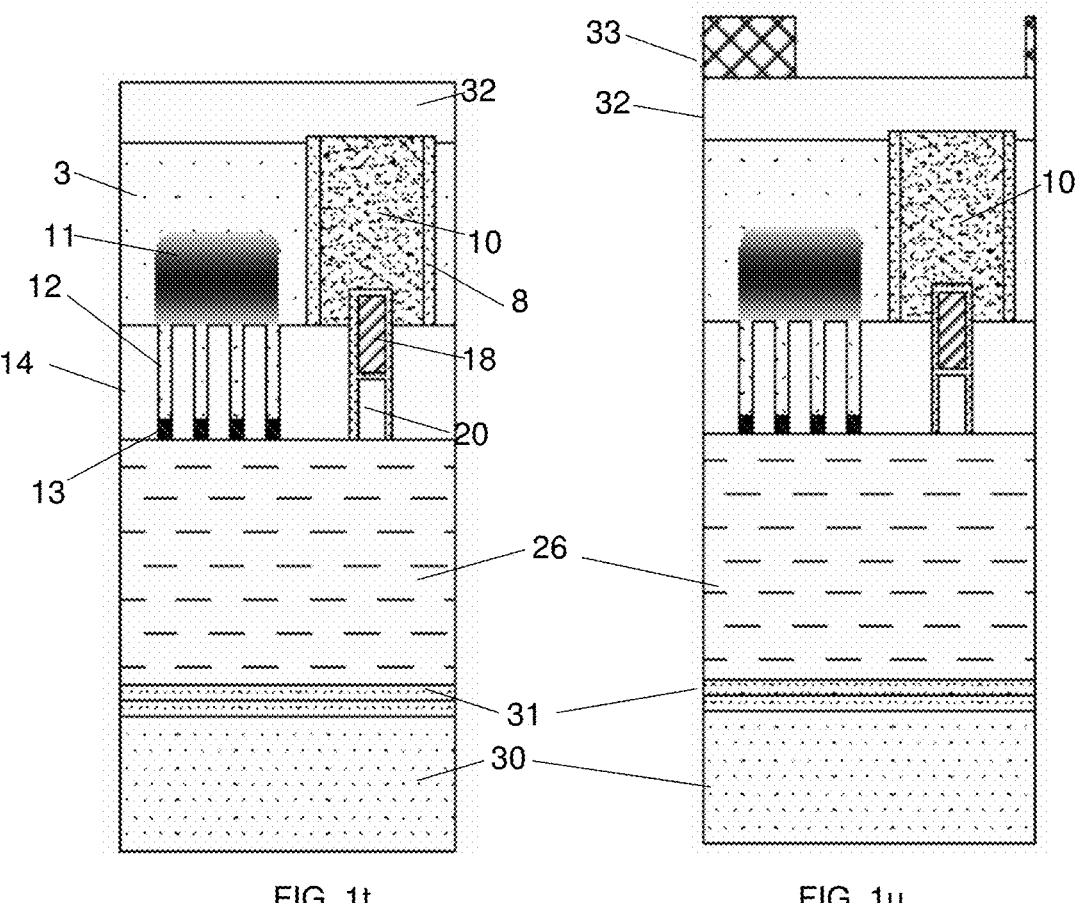
Figures 1X, 1Y:
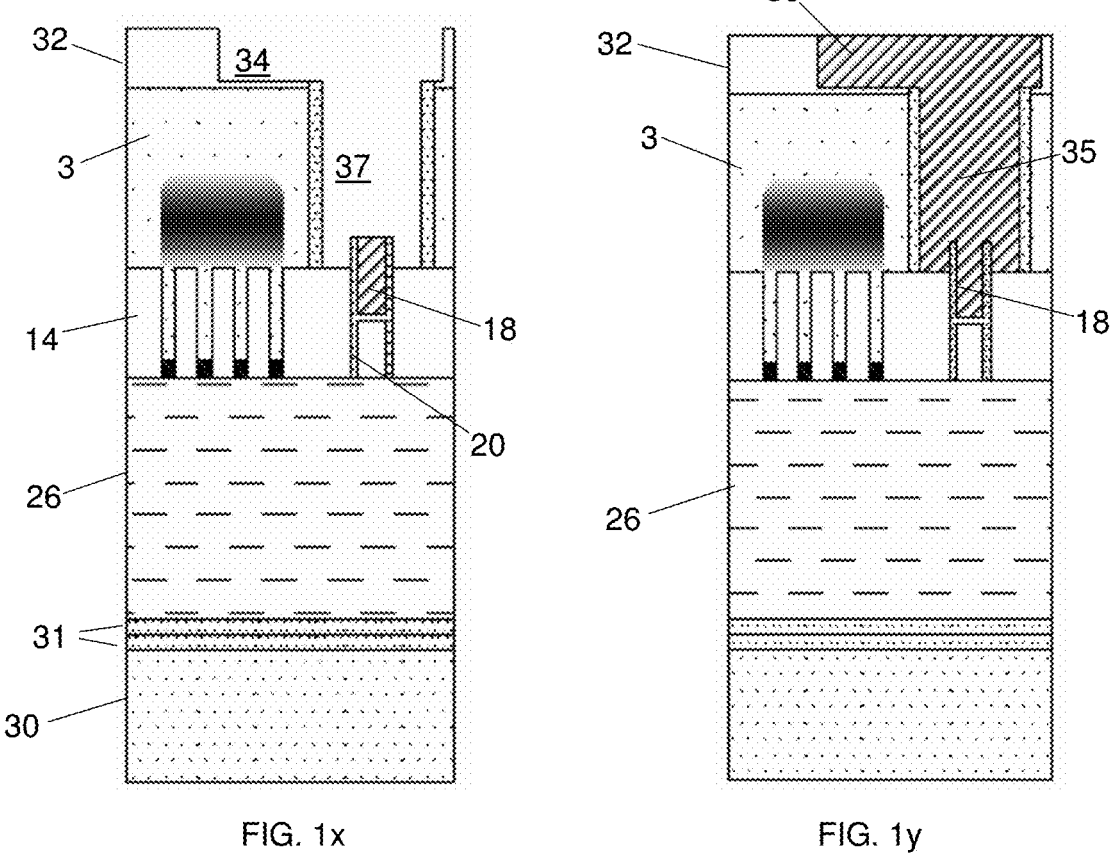

In the embodiment described in FIGS. 1a to 1y, the method according to a first aspect is applied to a silicon wafer 1, onto which is produced a monocrystalline blanket SiGe layer 2, followed by the deposition of a monocrystalline Si layer 3 (FIGS. 1a and 1b). In some embodiments different semiconductor materials other than Si and SiGe may be used. In the described examples Si and SiGe are non-limiting examples of semiconductors that are suitable for this method. The thickness of the SiGe layer 2 may be between 10 nm and 100 nm. The thickness of the top Si layer 3 may be between 200 nm and 1000 nm. However, other larger ranges of thicknesses may be used. The top Si layer 3 serves as the substrate of integrated circuits processed on the wafer 1. A thin layer of silicon nitride (not shown) may additionally be applied on the top Si layer 3 as a capping layer for the subsequent deposition of hardmasks. The SiGe layer 2 can serve as an etch stop layer when the bulk Si wafer 1 is removed later in the process. The term 'blanket etch stop layer' is used herein and in the appended claims to distinguish etch stop layer 2 from a further, locally applied, etch stop layer appearing only in some embodiments. The term 'blanket' indicates that the etch stop layer 2 is deposited preferably across the complete surface of the wafer, or at least on a surface corresponding to a significant portion of the ICs that are to be processed on the wafer. Methods applicable for producing layers 2 and 3, including the optional SiN layer, are known as such and will not be described in more detail in the present context. The etch stop layer 2 can play an additional role, in the application of a 'via-first' approach for producing TSV connections through the Si substrate 3 of ICs processed on the front side of the wafer 1.

As shown in FIG. 1c, multiple via openings 6 and 7 are produced by known lithography and etching technology. In the embodiment shown in the drawings, two types of vias are produced: vias 6 which will serve for the production of alignment marks for positioning etch masks on the back side of the wafer later in the process, and vias 7 which will serve for the production of TSV connections or openings. Both these via opening types are produced simultaneously in a single etch step, stopping on the SiGe layer 2, as illustrated in FIG. 1*c*.

The subsequent steps are described in a detail drawing of one of the TSV-related via openings 7, the limits of the detail drawing being indicated by the rectangle 4 in FIG. 1*c*. The dimensions of these vias 7 are small, having a diameter of less than one micrometre. The TSVs produced in these vias 7 will also be referred to hereafter as nano-TSVs. As seen in FIG. 1*d*, an oxide layer 8 can be deposited conformally on the top surface of the Si layer 3, and on the walls and bottom of the TSV-via opening 7, forming a liner 8 inside the opening 7. This may be a silicon oxide layer, deposited by chemical vapour deposition. A reactive ion etch (RIE) plasma process can be applied, see FIG. 1*e*, to remove the oxide from the upper surface of the wafer and from the bottom of the via opening 7, whilst maintaining the oxide layer 8 on the via's sidewalls. This process is described, for example, in patent publication document EP3035369, incorporated herein by reference.

The next step is illustrated in FIG. 1*f*. SiGe is grown locally in the via opening, using the SiGe at the bottom of the via opening as a seed layer, until the via opening 7 is completely filled with a pillar 10 of grown SiGe, extending slightly above the level surface of the Si layer 3. In some cases, SiGe may be a sacrificial layer, as it may be removed in further steps of the process. This local deposition method is known as such, and details of the applied parameters are therefore not given in the present context. The step is applicable to other materials besides SiGe provided that the material deposited in the via opening 7 is the same or compatible with the material of the etch stop layer 2. A material is compatible when it is epitaxially similar to the material of the etch stop layer, so that the etch stop layer 2 can act as a seed layer for the local growth of the material. Following this, the upper surface of the wafer is planarized using standard techniques such as CMP (chemical mechanical polishing), removing the SiGe extending above the level surface, and possibly slightly thinning the Si layer 3, so that a level upper surface is obtained, as illustrated in FIG. 1*g*.

The result shown in FIG. 1*g* may be obtained by an alternative method, which is to deposit SiGe on the entire wafer by chemical vapour deposition (CVD), the SiGe filling all via openings 6 and 7 and forming a layer on the upper surface of the complete wafer, followed by planarization to thereby remove the SiGe from the upper surface. When this alternative is applied, the material used for filling the via openings need not be the same as or compatible with the material of the etch stop layer 2. For example, polysilicon or amorphous carbon could be used to fill the via openings 6 and 7, combined with a SiGe etch stop layer 2.

Regardless of how the pillar 10 of FIG. 1*g* is obtained, the result is a via opening filled with a sacrificial material, to be removed later in the process, as will be described further in this description.

First however, front end of line processing can occur, by implanting dopant elements of a given polarity to create well regions 11, one of which is illustrated in FIG. 1*h*. Methods for realizing well regions are known in the art, and not disclosed in detail in the present context. Then lithography and etching steps are applied for creating fin-shaped structures in the Si layer 3, as illustrated in FIG. 1*i*, showing four fins 12 above the well region 11. On top of the fins 12, the patterned hardmask portions 13 (for example SiN) used for etching the fins are still present. The well region 11 and the fins 12 are located adjacent to the SiGe pillar 10. Additional groups of fins can be formed across the wafer surface, adjacent to additional SiGe pillars and above well regions of the same or opposite polarity as the well region 11, in accordance with the design layout of the ICs that are being processed on the wafer 1. The pillar 10 is partially etched away during the formation of the fins 12. The remaining pillar is still referred to by reference numeral 10.

Additional FEOL processing steps are then performed which are not detailed in the present context. These steps include the creation of gate, source and drain areas and contacts on the fins, in accordance again with a desired FEOL layout. After these steps, a layer 14 of a dielectric material, for example silicon oxide is deposited and planarized, as illustrated in FIG. 1*j*. The hardmask portions 13 are still shown in FIG. 1*j*, and may still be present at specific areas along the length of the fins, but it is to be understood that in the view shown in FIG. 1*j*, all active devices of the FEOL portion have been manufactured and are ready to be interconnected by the BEOL interconnect structure that is to be processed on the planarized surface of layer 14. However in the particular embodiment shown, buried contact rails are produced before processing the BEOL. To this purpose, elongated trenches 15 are etched, parallel to each other and to the fins 12, passing through the dielectric layer 14 and extending into the Si layer 3. One trench 15 is shown in FIG. 1*k*, but according to preferred embodiments, an array of regularly spaced trenches is formed. As seen in the drawing, the trench 15 intersects the pillar 10, in other words the trench overlaps the pillar 10 and partially cuts through the pillar, preferably running centrally with respect to the pillar's cross-section. With reference to FIG. 1*l*, a dielectric liner 16, for example silicon nitride, can then be deposited conformally on the surface of the oxide layer 14 and on the sidewalls and bottom of the trench 15. This can be followed by depositing an electrically conductive layer 17, for example a tungsten layer; in the trenches 15 and on the upper surface of layer 14, and planarizing said upper surface to the level of the liner 16, as shown in FIG. 1*m*. The conductive material in the trench 15 can then etched back to about half the depth of the trench, see FIG. 1*n*, to form the buried rail 18, and a further dielectric liner 19, preferably of the same material as the liner 16, for example silicon nitride, is deposited on the upper surface of the rail 18, forming also on top of the liner 16 on the upper surface of the wafer, as illustrated also in FIG. 1*n*. Aa dielectric 20 can be deposited in the trench formed above the rail 18 and the upper surface is planarized until the dielectric material of layers 16 and 19 is removed, see FIG. 1*o*. Further steps, sometimes referred to as MOL (middle end of line), can occur. These steps are sometimes regarded as part of the BEOL process. In this MOL part of the process, local interconnects are produced between active devices, and also between a number of the active devices and the buried rails 18. Such local interconnects are not shown in the drawings. Therefore, in FIG. 1*p*, the BEOL portion is schematically shown as a layer 26, lying on the FEOL portion 25, the latter comprising the well regions 11, the fins 12 and the buried rails 18.

Referring then to FIG. 1*q*, the wafer 1 is flipped and bonded face down to a carrier wafer 30. Bonding preferably takes place by a direct dielectric-to-dielectric bonding process, involving dielectric bonding layers 31 deposited on the surfaces of the device wafer 26 and of the carrier wafer 30. The bulk Si wafer 1 is then removed, as illustrated in FIG. 1*r*. This may be done by multiple process steps, including grinding and polishing steps such as CMP, as well as wet etching steps. The last step of the bulk Si removal process is a wet etching step that is selective with respect to SiGe, so that the etch process stops on the SiGe etch stop layer 2. This step may also be performed with wet etching materials that are selective with respect to the material in pillar 10. This result is shown in FIG. 1r. By a different etch process, the SiGe layer itself is then removed. This is followed by an RIE etch of the Si layer 3 relative to the SiGe pillar 10 and the oxide layers 8, to partially etch back the silicon of layer 3, so that the Si is retracted relative to the pillar 10 and the oxide liner 8 as shown in FIG. 1s.

A silicon oxide layer 32 is then deposited, as shown in FIG. 1t, and this layer is patterned by deposition and patterning of a mask layer 33, for example a resist layer, see FIG. 1u. The positioning of this mask 33 is realized using alignment marks produced by the above steps in the vias 6 (FIG. 1c). These alignment marks consist of pillars of SiGe, or other materials, formed in the latter vias 6. Preferably each alignment mark consists of a plurality of closely spaced SiGe pillars. By etching the oxide layer 32 with the mask 33 in place, an area 34 is defined (FIG. 1v), corresponding to a conductor of a first interconnect level to be processed on the back side of the substrate 3. This conductor is to be connected to the TSV connection that is to be produced at the location of the pillar 10. FIG. 1v shows the result of etching the oxide layer 32 and stripping the mask 33. The layer 32 is etched until reaching the back of the SiGe pillar 10.

The SiGe of the pillar 10, or other suitable material present in pillar 10, is then selectively removed, see FIG. 1w, thereby creating an open cavity 37, with a portion of the bottom of the rail 18 and its liner 16 being exposed inside the cavity. The selective removal of the SiGe, or other materials, can be done by a wet etch process or by RIE. Then the oxide liner 16 on the bottom of the rail 18 that is exposed in the cavity 37 is removed while maintaining the liner 16 on the sidewalls, see FIG. 1x, followed by deposition of an electrically conductive material to simultaneously fill the cavity 37 and the area 34 in a dual damascene-type process. Possibly a further liner and/or barrier layer is deposited prior to depositing the conductive material, which may be, for example, copper deposited by electrodeposition. In this way, and with reference to FIG. 1y, the TSV connection 35 is created between the rail 18 and a conductor 36 of a first interconnect level on the back side of the substrate 3. This first interconnect level may be the first level of a power delivery network processed on the back side of the wafer, as known per se in the art. When the backside network is completed (not shown), the finished ICs may be released from the carrier 30 before or after separating the ICs from each other, according to any known method.

In the embodiment described above, the SiGe layer 2 serves not only as an etch stop layer for controlling the thickness of the substrate 3 at the end of the backside thinning process, but also as an etch stop layer for controlling the depth of the via openings 7 produced in a via-first approach for producing nano-TSVs. This allows improved control both of the thinning process and of the etching of the via openings, which is useful especially in the context of a FEOL portion comprising buried interconnect rails 18.

Figures 2A, 2B, 3A, 3B, 3C:
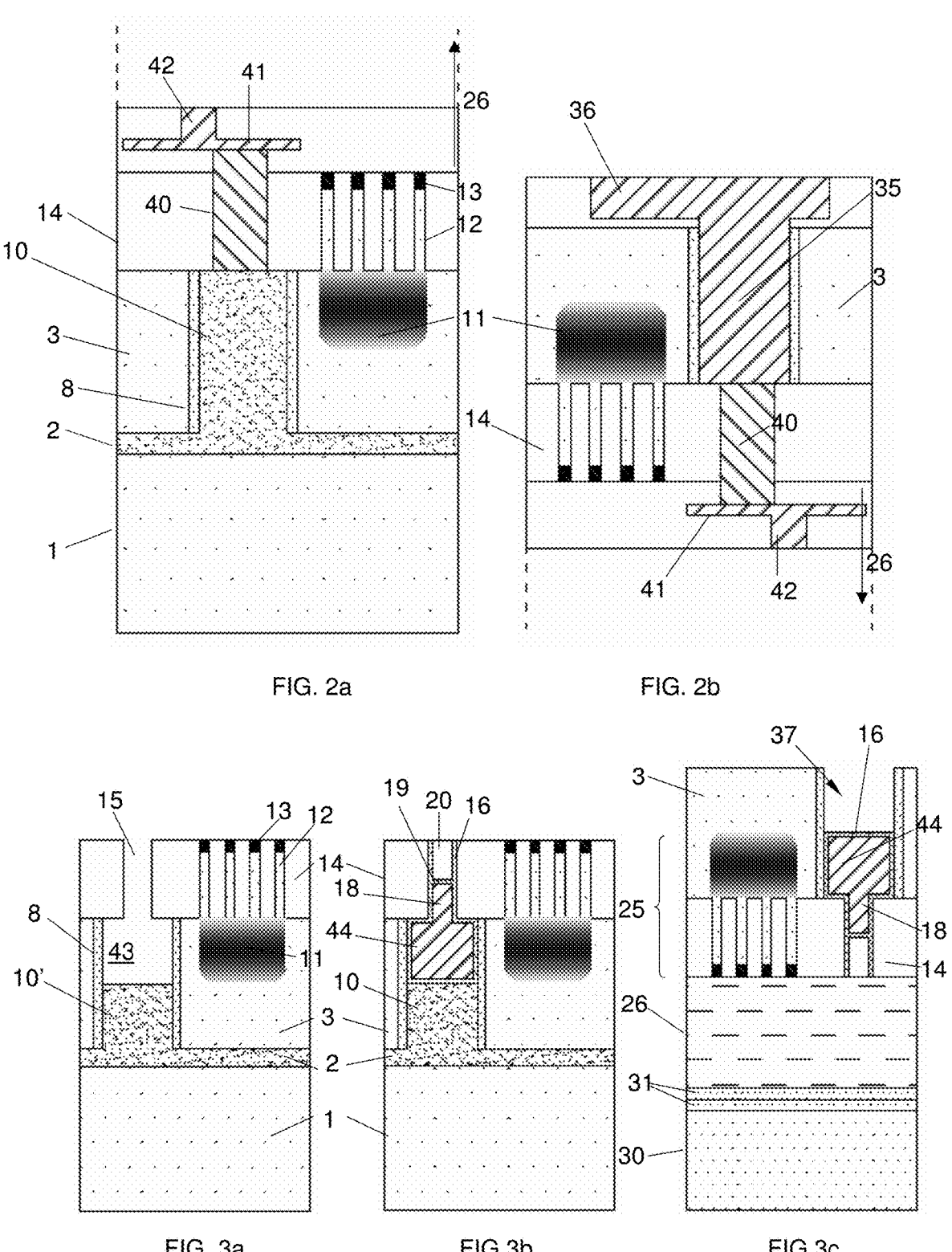
FIGS. 2a and 2b schematically illustrate a second method for producing an IC, according to an embodiment.
FIGS. 3a to 3e schematically illustrate a third method for the fabrication of an IC on a wafer provided with an etch stop layer.

Nevertheless, the embodiment is not limited to this context, and can be applied also to a FEOL portion that does not comprise buried interconnect rails. FIG. 2a illustrates a FEOL portion 25 with a tungsten via connection 40 that is in physical contact with the SiGe pillar 10. This pillar 10 is obtained by the same steps as illustrated in FIGS. 1a to 1j. The W via connection 40 passes through the dielectric layer 14 and connects to a first layer of copper conductors 41 and vias 42 in the BEOL layer 26. The production of the W via connection 40 can be done, as part of the middle-end-of line process, as referred to above. However in the context of the present application, the via connection 40 is regarded as part of the FEOL portion 25. After bonding the wafer 1 face down to a carrier and performing the same steps as described with reference to FIGS. 1r to 1y, the result as shown in FIG. 2b is obtained.

Figure 3D:
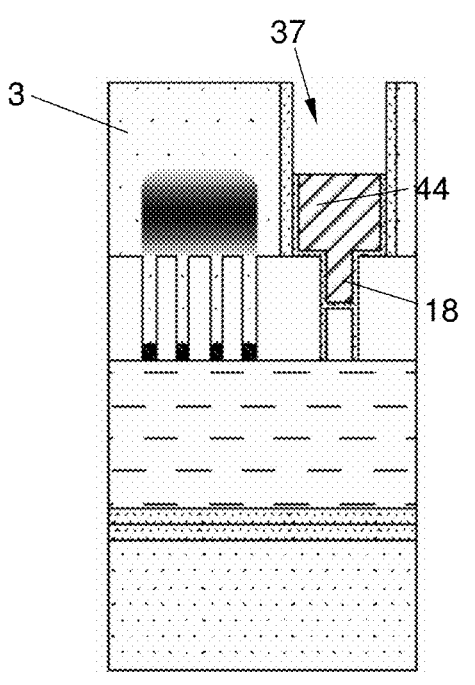
Figure 3E:
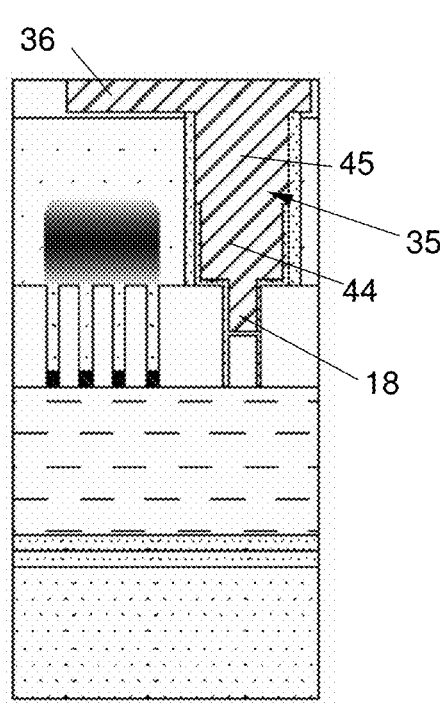

A second aspect is described with reference to two embodiments of the method according to this second aspect, respectively shown in FIGS. 3a to 3e and FIGS. 4a to 4e. FIG. 3a shows an intermediary situation following the steps described in FIGS. 1a to 1k. According to the second aspect, the SiGe pillar 10 is partially etched back through the opening of the trench 15, creating a first open cavity 43 above a pillar 10' that is reduced in height compared to the embodiments described above in relation to the first aspect. This may be done by a wet or dry etch, according to any known suitable etch recipe. The etch process is isotropic, it removes SiGe, or other suitable sacrificial material, also from underneath the re-entrant edges of the trench 15. In FIG. 3b, the liner 16 is deposited, lining the interior surface of the trench 15, including the sidewalls of the trench, as well as the interior surface of the cavity 43, including the sidewalls of the cavity. In FIG. 3b, an electrically conductive material is then deposited in the cavity 43 and in the trench 15, and the same steps are performed as previously described in FIGS. 1a-1y, leading to the formation of the buried rail 18 and the additional liner 19, and to the formation of an electrically conductive pad 44 in the cavity 43, after deposition of the dielectric layer 20 and planarization to the level of the upper surface of the dielectric layer 14. The conductive pad 44 is integral with the buried rail 18. The material of the liner 16 and the conductive material fills the parts of the cavity 43 underneath the re-entrant edges of the trench 15. This can be achieved by using appropriate materials, such as a stack of Ti and TiN, or only TiN, deposited by atomic layer deposition (ALD) as the dielectric layer 16 and tungsten as the conductive material, deposited by CVD using $WF_6$ as a precursor. After this, FEOL processing is continued and BEOL processing is done as in the previously described embodiments of the first aspect, producing respectively FEOL and BEOL portions 25 and 26, and the wafer 1 is then bonded face down to a carrier wafer 30, see FIG. 3c. In FIG. 3c this is followed by removal of the bulk wafer 1, stopping on the SiGe layer 2, and by removal of the SiGe stop layer 2 itself, as previously described. This last step also removes the reduced-height SiGe pillar 10', and thereby produces the open cavity 37, now termed second open cavity, following the first open cavity 43, exposing the bottom of the conductive pad 44, still covered by the liner 16. The exposed portion of the liner 16 is then removed, thereby exposing the pad 44 at the bottom of the second open cavity 37, as shown in FIG. 3d. Following this, and with reference to FIG. 3e, the dual-damascene-type steps are performed as described with respect to the first aspect, leading to the formation of the TSV connection 35 connected to a conductor 36 of a first back side interconnect level. The TSV connection 35 now consists of the previously formed pad 44 and a portion 45 deposited in the dual damascene step.

The exposed surface of the pad 44, as seen in FIG. 3d, forms a larger contact surface than the backside surface of a buried rail 18, which is the contact area contacted by the TSV connection in the embodiment according to the first aspect, described with reference to FIGS. 1a to 1y. This larger contact surface enables a lower contact resistance and hence a better connectivity through the TSV connection 35, between the front and back side of the IC.

Figures 4A, 4B, 4C:
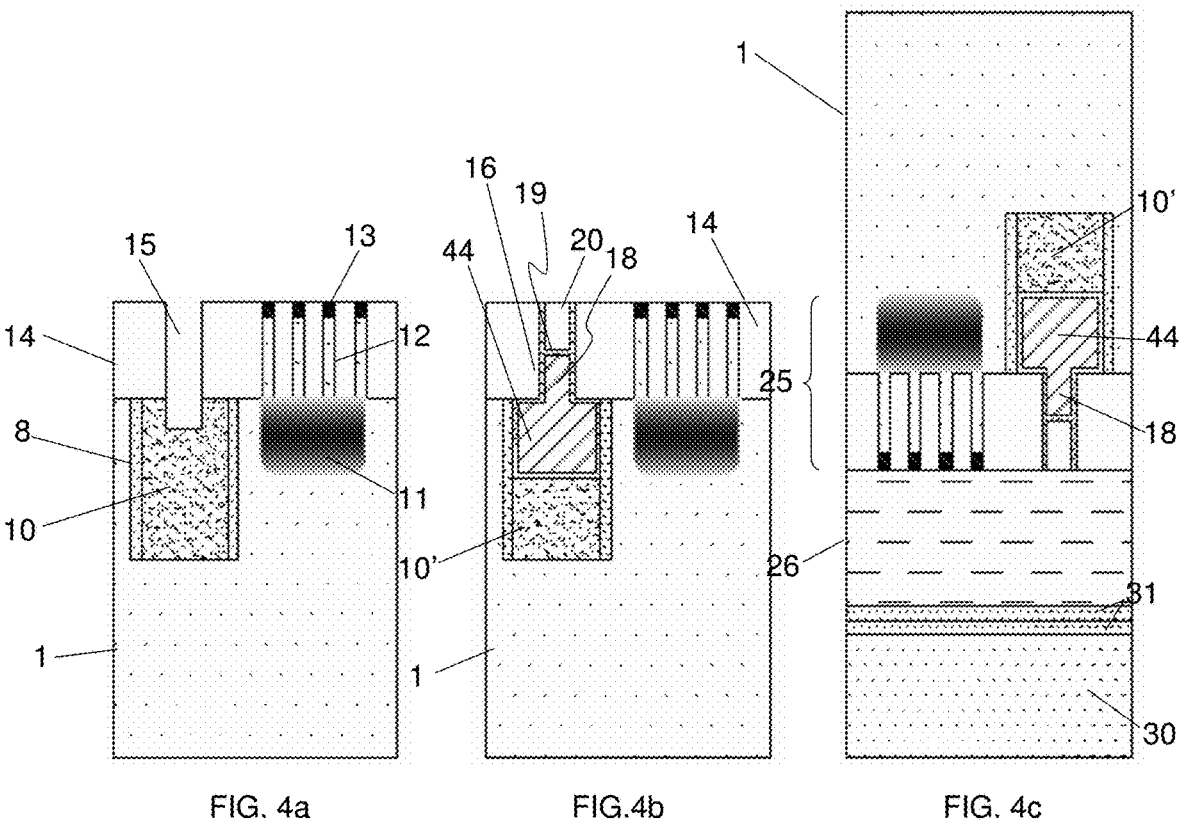

The second aspect is limited to the context of an IC comprising buried interconnect rails 18 and the formation of a nano-TSV by a via-first approach, using a sacrificial material. Contrary to the first aspect, the scope of the second aspect is however not limited by the presence of the etch stop layer 2. This is illustrated in FIGS. 4a to 4e. The situation shown in FIG. 4a is obtained by performing the method steps of FIGS. 1a to 1k on a monocrystalline Si wafer, but could also be performed on a wafer comprising an etch stop layer 2 and a further Si layer 3 on top of the etch stop layer 2. The etching of the openings 7 (and possibly openings 6 for forming alignment marks) is now done by a timed etch, stopping at a given depth within the wafer 1. The same steps are performed as according to the first aspect, by depositing and etching back the liner 8, filling the via opening 7 with a sacrificial material, possibly but not necessarily SiGe, to obtain the pillar 10, and processing the fins 12 followed by depositing the dielectric layer 14. This is then followed by etching the trench 15, as shown in FIG. 4a. Etching back the sacrificial material to form a cavity and filling the cavity and the trench 15 with a dielectric liner 16 and with an electrically conductive material, for example tungsten, is done in the same way as in the embodiment shown in FIGS. 3a to 3e, leading to the situation shown in FIG. 4b, including the conductive pad 44 above the reduced-height sacrificial pillar 10'. Then FEOL processing is continued and BEOL processing is done to produce the FEOL and BEOL portions 25 and 26 and the wafer is again bonded face down to a carrier wafer 30, see FIG. 4c.

Figures 4D, 4E, 5A, 5B:
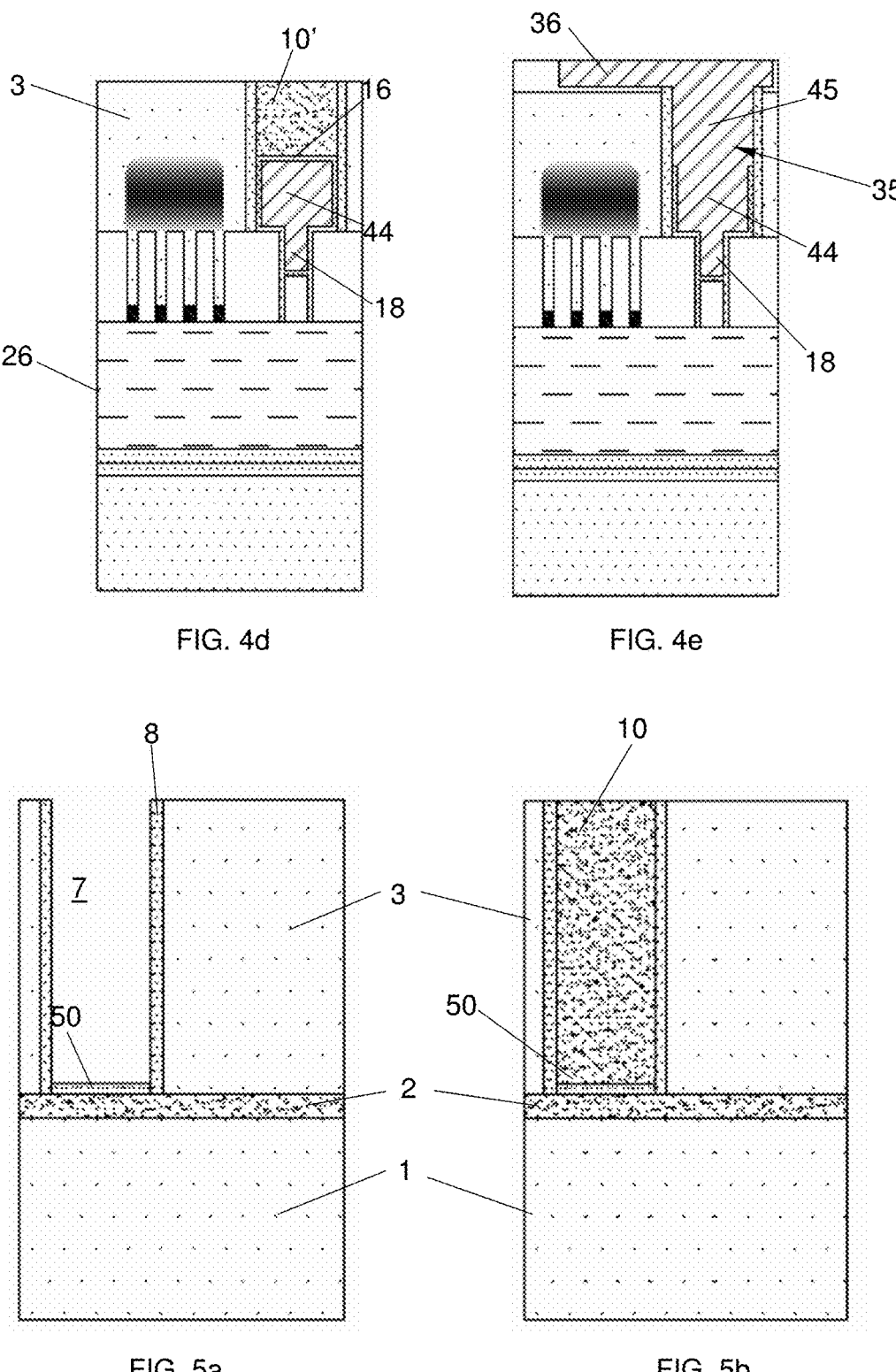

Thinning of the wafer 1 now takes place until the reduced-height pillar 10' is exposed, as shown in FIG. 4d, after which the sacrificial material of the pillar 10' is removed, and the TSV connection 35 is completed, as shown in FIG. 4e, by the dual damascene steps already described in relation to the previous embodiments.

In FIG. 1r, it is to be noted that the removal of the etch stop layer 2, for example by wet etching, could also remove a portion of the pillar 10, which may lead to the removal of a considerable Si thickness in the step shown in FIG. 1s, in order to recess the Si surface relative to the SiGe pillar 10. The unwanted removal of SiGe material from the pillar during etching the SiGe layer 2 could therefore make it difficult to maintain adequate control of the thickness of the Si layer 3. According to an embodiment, an etch stop layer is deposited at the bottom of the via opening 7, prior to filling this via opening with SiGe or another sacrificial material as illustrated in FIGS. 5a and 5b. The etch stop layer 50 at the bottom of the via opening 7 is produced after depositing the liner 8 and after removing this liner 8 from the bottom of the via opening 7 The liner 8 could be a thin silicon layer, having for example a thickness of about 10 nm. The layer 50 may be obtained for example by local epitaxial growth of Si on the SiGe of the etch stop layer 2, using this SiGe as the seed layer for local Si growth, taking advantage of the epitaxial similarity between these materials. The SiGe pillar 10 may be produced by local epitaxial growth of SiGe on the Si layer 50 or by depositing SiGe on the entire wafer, for example by CVD, and planarizing the upper surface.

The removal of the SiGe etch stop layer 2 now stops on the Si etch stop layer 50, as illustrated in FIG. 5c. Then the Si etch stop layer 50 is removed by etching back both this layer 50, stopping on the SiGe pillar 10, and the Si layer 3, as illustrated in FIG. 5d. The latter is etched back beyond the height of the pillar 10, in order to recess this layer 3 relative to the pillar 10, as seen in FIG. 5d. After this, the method continues as described with respect to 1t to 1y. The etch stop layer 50 enables a better control of the final thickness of the Si layer 3. The embodiment described with reference to FIGS. 5a to 5d is applicable both in the first aspect, and in the embodiment of the second aspect wherein the blanket etch stop layer 2 is present (as in FIGS. 3a-3e).

While certain embodiments have been illustrated and described in detail in the drawings and foregoing description, such illustration and description are to be considered illustrative or exemplary and not restrictive. Indeed, the novel apparatus, methods, and systems described herein may be embodied in a variety of other forms; furthermore, various omissions, substitutions and changes in the form of the methods and systems described herein may be made without departing from the spirit of the disclosure. The various features and processes described above may be implemented independently of one another, or may be combined in various ways. All suitable combinations and sub combinations of features of this disclosure are intended to fall within the scope of this disclosure.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A method of fabricating an interconnect structure on a back side of a semiconductor substrate portion of an integrated circuit chip, the method comprising:

providing a semiconductor substrate formed of a bulk semiconductor wafer, a blanket etch stop layer on the bulk semiconductor wafer, and a top semiconductor layer on the blanket etch stop layer, wherein a portion of the top semiconductor layer comprises the semiconductor substrate portion of the integrated circuit chip;

etching at least one through semiconductor via opening in the top semiconductor layer to the blanket etch stop layer, wherein the blanket etch stop layer forms a bottom of the through semiconductor via opening;

forming a pillar by filling the at least one through semiconductor via opening with a sacrificial material;

after forming the pillar, producing a front end of line portion of the integrated circuit chip on a front side of the top semiconductor layer, wherein producing the front end of line portion comprises recessing portions of a top surface of the top semiconductor layer and a top surface of the pillar and forming at least one electrically conductive structure on and in physical contact with the pillar;

producing a back end of line portion of the integrated circuit chip on top of the front end of line portion;

bonding the front side of the semiconductor substrate to a carrier substrate;

thinning the semiconductor substrate by removing the bulk semiconductor wafer and etching the semiconductor substrate until the blanket etch stop layer is exposed;

removing the blanket etch stop layer;

removing the sacrificial material of the pillar in order to create an empty cavity, thereby exposing at least one electrically conductive structure of the front end of line portion;

filling the empty cavity with an electrically conductive material, thereby creating a through semiconductor via connection from a front portion of the top semiconductor layer to a back portion of the top semiconductor layer; and producing the interconnect structure on the back portion of the top semiconductor layer, wherein the interconnect structure contacts the through semiconductor via connection, and wherein the interconnect structure is connected to the front side of the semiconductor substrate portion by at least one through semiconductor via connection.

2. The method according to claim 1, wherein the sacrificial material of the pillar comprises the same material as or an epitaxially similar material to a material of the blanket etch stop layer, and wherein the pillar is produced by local deposition of the sacrificial material, using the material of the blanket etch stop layer at the bottom of the at least one through semiconductor via opening as a seed layer.

3. The method according to claim 1, wherein a second etch stop layer is produced on the bottom of the at least one through semiconductor via opening, followed by deposition of the sacrificial material directly on top of the second etch stop layer, and wherein the second etch stop layer is suitable for stopping the removal of at least a portion of the blanket etch stop layer from an etching material.

4. The method according to claim 1, wherein the conductive structure of the front end of line portion comprises an array of interconnect rails that is at least partially buried in the top semiconductor layer, and wherein the array of interconnect rails intersects the pillar.

5. The method according to claim 4, wherein a dielectric liner separates the array of interconnect rails from surrounding portions of the semiconductor substrate, and wherein removal of the sacrificial material of the pillar includes removing an exposed portion of the dielectric liner.

6. The method according to claim 1, wherein at least one conductive structure of the front end of line portion is an interconnect via connected to an interconnect level of the back end of line portion.

7. The method according to claim 1, wherein a dielectric layer is produced on sidewalls of the at least one through semiconductor via opening prior to depositing the sacrificial material in the through semiconductor via opening.

8. The method according to claim 1, wherein additional via openings are produced simultaneously with the at least one through semiconductor via opening, the additional via openings being filled with the same sacrificial material as the at least one through semiconductor via opening.

9. The method according to claim 8, wherein the filled additional via openings comprise alignment marks suitable for positioning one or more etch masks on the back portion of the top semiconductor layer.

10. The method according to claim 1, wherein the blanket etch stop layer comprises SiGe, and wherein the top semiconductor layer is formed by epitaxially growing on the blanket etch stop layer.

11. A method of fabricating an interconnect structure on a back side of a semiconductor substrate portion of an integrated circuit chip, the method comprising:

providing a semiconductor substrate comprising a bulk semiconductor material or a top layer of a semiconductor material, wherein the semiconductor substrate portion of the integrated circuit chip is formed by an upper layer of the bulk semiconductor material or by the top layer of the semiconductor material;

etching at least one through semiconductor via opening in the semiconductor substrate;

forming a pillar by filling the at least one through semiconductor via opening with a sacrificial material;

after forming the pillar, producing a front end of line portion of the integrated circuit chip on the semiconductor substrate, the front end of line portion comprising an array of interconnect rails that is at least partially buried in the semiconductor substrate, wherein:

producing the front end of line portion comprises recessing portions of the semiconductor substrate and a top surface of the pillar, the interconnect rails are produced by etching at least one trench in the semiconductor substrate, wherein the at least one trench intersects the pillar causing at least a portion of the sacrificial material to be removed and creating a first open cavity above the pillar, and an electrically conductive material is deposited in the at least one trench and in the first open cavity above the pillar, forming a buried rail in the at least one trench and an electrically conductive pad that is integral with the buried rail;

producing a back end of line portion on the integrated circuit chip on top of the front end of line portion;

bonding a front side of the semiconductor substrate to a carrier substrate;

thinning the semiconductor substrate from the back side until the pillar is exposed;

creating a second open cavity by removing the sacrificial material of the pillar, wherein the electrically conductive pad is exposed in the second open cavity;

filling the second open cavity with an electrically conductive material creating a through semiconductor via connection from the front of the semiconductor substrate to the back of the semiconductor substrate; and producing the interconnect structure on the back side of the semiconductor substrate portion, the interconnect structure contacting the at least one through semiconductor via connection, and wherein the interconnect structure is connected to the front side of the semiconductor substrate by the at least one through semiconductor via connection.

12. The method according to claim 11, wherein the semiconductor substrate comprises a bulk semiconductor wafer, a blanket etch stop layer on the bulk semiconductor wafer, and a top semiconductor layer on the etch stop layer, and wherein:

the at least one through semiconductor via opening is etched through the top semiconductor layer until the blanket etch stop layer, wherein the blanket etch stop layer forms a bottom of the through semiconductor via opening.

13. The method according to claim 12, wherein thinning the semiconductor substrate further comprises removing the bulk semiconductor wafer from the etch stop layer via an etch process.

14. The method according to claim 13, further comprising removing the blanket etch stop layer and removing the pillar, producing the second open cavity.

15. The method according to claim 14, wherein the sacrificial material of the pillar is the same material as or epitaxially similar to a material of the blanket etch stop layer.

16. The method according to claim 15, wherein a second etch stop layer is produced on a bottom of the via opening, and the sacrificial material is deposited on top of the second etch stop layer.

17. The method according to claim 16, wherein the second etch stop layer is suitable for stopping the removal of at least a portion of the blanket etch stop layer by an etching process.

18. The method according to claim 11, wherein a dielectric liner separates the buried rails and the electrically conductive pad from surrounding portions of the semiconductor substrate, and wherein removing the sacrificial material of the pillar includes removing an exposed portion of the dielectric liner.

19. The method according to claim 11, wherein a dielectric layer is produced on sidewalls of the at least one through semiconductor via opening prior to depositing the sacrificial material in the at least one through semiconductor via opening.

20. The method according to claim 11, wherein multiple additional via openings are produced simultaneously with the at least one through semiconductor via opening, wherein the additional via openings are filled with the same sacrificial material as the through semiconductor via opening.

21. The method according to claim 20, wherein the filled additional via openings comprise alignment marks suitable for positioning one or more etch masks on the back side of the semiconductor substrate.

22. The method according to claim 12, wherein the blanket etch stop layer comprises SiGe, and wherein the top semiconductor layer is formed by epitaxially growing on the blanket etch stop layer.

* * * * *